(12) United States Patent
Yi et al.

(10) Patent No.: US 7,682,164 B2
(45) Date of Patent: Mar. 23, 2010

(54) ELECTRICAL CONNECTOR

(75) Inventors: Qi-Jin Yi, ShenZhen (CN); Yao-Chi Huang, Tu-Cheng (TW); Wen He, ShenZhen (CN); Lu Zhao, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 241 days.

(21) Appl. No.: 11/827,193

(22) Filed: Jul. 11, 2007

(65) Prior Publication Data

US 2008/0014782 A1 Jan. 17, 2008

(30) Foreign Application Priority Data

Jul. 11, 2006 (CN) .......................... 2006 2 0074875

(51) Int. Cl.
*H01R 12/00* (2006.01)

(52) U.S. Cl. ....................................................... 439/83

(58) Field of Classification Search ................. 439/342, 439/83
See application file for complete search history.

(56) References Cited

U.S. PATENT DOCUMENTS

| 5,057,031 | A  | * | 10/1991 | Sinclair ....................... 439/261 |
| 5,215,472 | A  | * | 6/1993  | DelPrete et al. ................ 439/71 |
| 6,340,309 | B1 | * | 1/2002  | Lin et al. ..................... 439/342 |
| 7,172,450 | B1 | * | 2/2007  | Sylvia et al. ................. 439/342 |
| 7,226,298 | B1 | * | 6/2007  | Minich ........................ 439/83 |

* cited by examiner

*Primary Examiner*—Phuong K Dinh
(74) *Attorney, Agent, or Firm*—Andrew C. Cheng; Wei Te Chung; Ming Chieh Chang

(57) ABSTRACT

An electrical connector (1) for attaching an IC package to a circuit member includes a base (3) defining four side walls, a number of terminals receiving in the base, a cover (4) slidably mounted on the base and a lever (5) slidably moving the cover relative to the base. The base defines a plurality of grooves (31) extending from one side wall of the base to any other side wall of the base and one end of the groove is communicated with exterior space to decline the temperature of the terminals.

1 Claim, 2 Drawing Sheets

ELECTRICAL CONNECTOR

BACKGROUND OF THE INVENTION

1. Field of the Invention

Embodiments of the present invention relate generally to electrical connectors and, more particularly, to electrical connectors for attaching IC packages to circuit members.

2. General Background

Conventionally, an electrical connector generally comprises a plate-like base housing defining a plurality of terminal-receiving cavities, a plurality of terminals embedded in the terminal-receiving cavities, a cover having a plurality of through holes in the same grid pattern as the lead pins of the IC package and a lever slidably moving the cover relative to the base housing.

The base housing and cover are slidably interconnected so that the cover is driven in a plane parallel to the underlying base housing between a first position where the lead pins can pass through the through holes of the cover to reach the terminals mounted in the base housing and a second position where the lead pins of the IC package contact the terminals.

The lever is rotatably attached to one end of the base housing and may be rotated from a horizontal position to a vertical position.

Each of the terminals has a contact portion in the terminal-receiving cavity of the base housing, and a solder tail extending below the bottom of the base housing. The solder tail is inserted into corresponding hole of the circuit member on which the electrical connector is mounted, and is soldered to the circuit member. The lead pins of the IC package are embedded in the through holes to reach the terminals, then rotating the lever from the vertical position to the horizontal position in which the lead pins of the IC package contact the terminals and the IC package is electrical connected to the circuit member via the electrical connector.

However, there are some inadequacies in the electrical connector: firstly, the terminals are assembled in the nearly sealed terminal-receiving cavities after the IC package is electrically connected with the circuit member. When the current through the terminals gets greater and greater, the temperature of the terminals gets higher and higher so that the whole transmission system is not stable. Secondly, when the electrical connector is soldered to the circuit member, the heat between the electrical connector and the circuit member is not prone to emit to the outer as the distance from the bottom surface of the electrical connector to the PCB is small, and this will lead to bad soldering ability.

In view of the above, a new electrical connector which overcomes the above-mentioned disadvantages is desired.

SUMMARY

Therefore, a need exists for an electrical connector which can dissipate heat produced by the terminals during working process.

According to a preferred embodiment of the invention, an electrical connector for attaching an IC package to a circuit member comprises a housing, a plurality of terminals. The housing includes a base having a plurality of terminal-receiving cavities for receiving the terminals, a cover slidably mounted on the base and a lever slidably moving the cover relative to the base. The housing defines four side walls, several grooves are defined from one side wall to another side wall and at least one end of the groove are communicated with the outer.

The present invention has several advantages as below: the housing defines several grooves from one side wall to another side wall and at least one end of the groove is communicated with the outer so that the heat around the terminals is transported to the outer via the grooves and the temperature of the terminals is declined.

The present invention will be well understood when read in junction with the following drawing, in which:

DETAILED DESCRIPTION OF THE PREFERRED EMBODIMENT OF THE INVENTION

Reference will now be made to the drawings to describe the present invention in detail.

Figure 1:
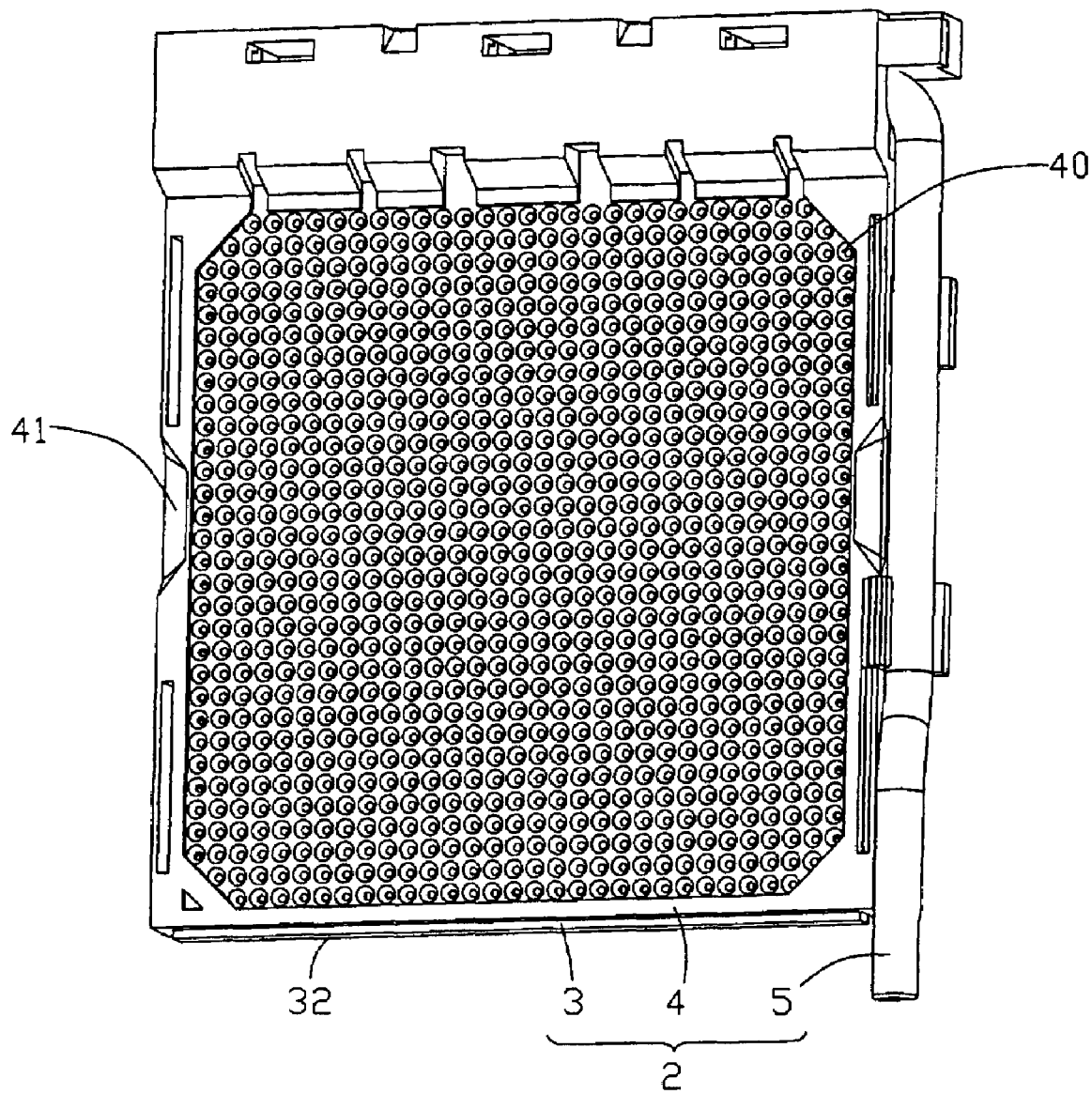
FIG. 1 is an assembled view of an electrical connector in accordance with a preferred embodiment of the present invention.
Figure 2:
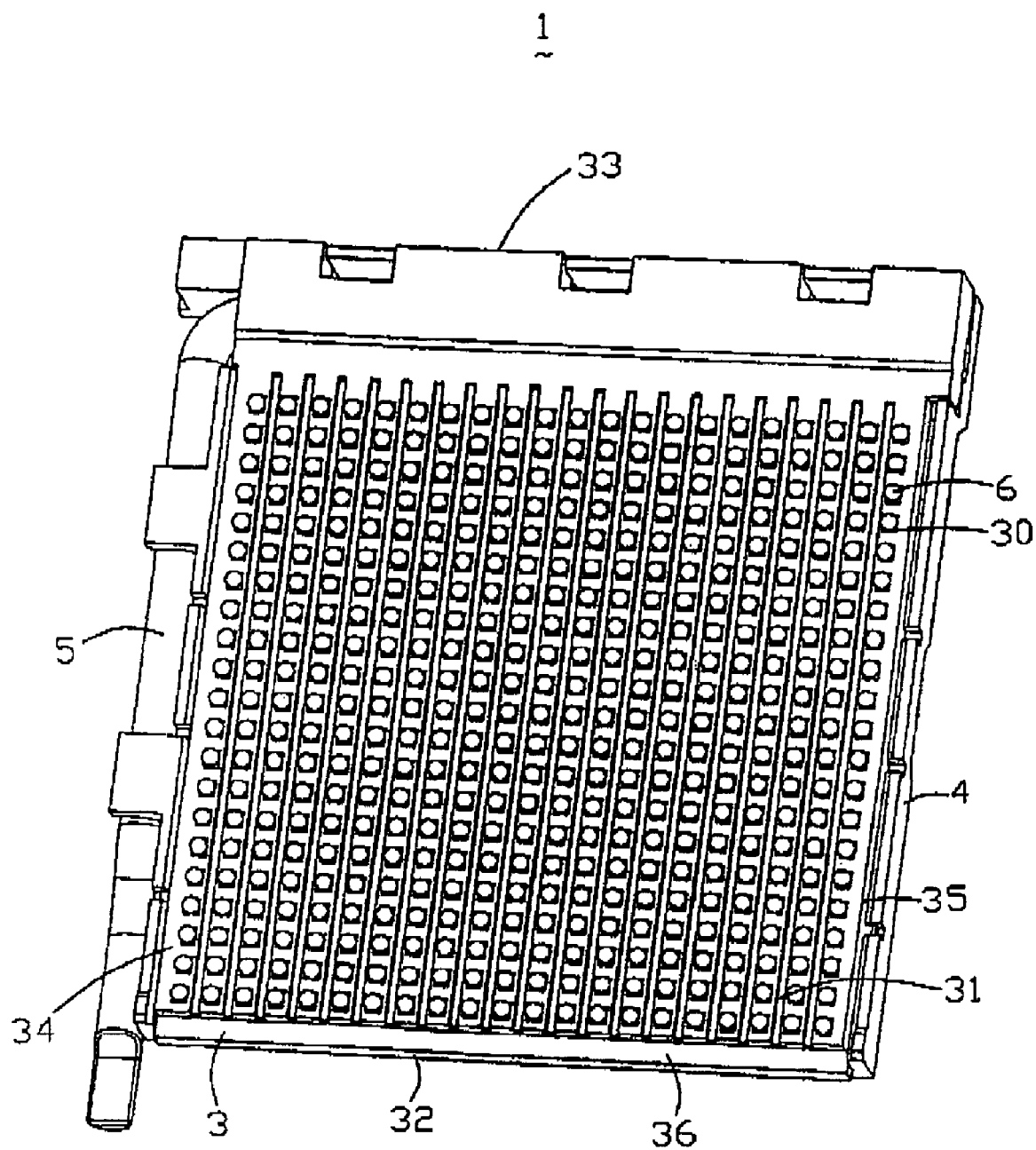
FIG. 2 is a bottom view of the electrical connector in accordance with the preferred embodiment of the present invention and only several terminals are shown.

Referring to FIGS. 1-2, an electrical connector 1 for attaching an IC package (not shown) to a circuit member (not shown) comprises a housing 2 and a plurality of terminals (not shown). The housing 2 includes a base 3 embedded a number of terminals, a cover 4 slidably mounted on the base 3 and a lever 5 slidably moving the cover 4 relative to the base 3.

The base 3 has a rectangle configuration and defines a plurality of terminal-receiving cavities 30. A plurality of terminals are provided with one of the terminals being mounted in each cavity 30. The base 3 defines a first side wall 32, a second side wall opposite to the first side wall 33, a third side wall 34 and a fourth side wall 35 adjacent to the first and second side wall 32, 33.

The terminals are embedded in the terminal-receiving cavities 30 and the bottom of the terminals defines a plurality of soldering balls 6, the soldering balls 6 partially extend below the bottom of the base 3 to solder to the circuit member.

Similarly, the cover 4 is a generally rectangular or square plate and has a plurality of through holes 40 in the same grid pattern as the lead pins of the IC package, thus permitting the lead pins to be inserted in the through holes 40. There are several recesses 41 on the side wall of the cover 4 so as to take off the IC package from the cover 4 conveniently.

The lever 5 is rotatably attached to one end of the base 3 and may be rotated from a horizontal position in which it is parallel to the base 3 to a vertical position in which it is right angle to the base 3.

Referring to FIG. 2, the bottom of the base 3 defines a plurality of soldering balls 6 in rows and a plurality of grooves 31 are defined between two adjacent rows of soldering balls. The grooves 31 extend from the first side wall 32 to the second side wall 33 and one end of each of the grooves 31 is communicated with exterior to dissipate heat, the grooves 31 can extend from one of the side wall of the base 3 to any other side wall of the base also. The groove 31 is defined in one end of the base 3 near the circuit member. In fact, the groove 31 may be defined in the opposite end of the base 3 according the actual requests. The first side wall 32 defines a plurality of openings 36 which is communicated with exterior space to increase the space of dissipate heat. When the current through the terminals gets more and more greater, the temperature of the terminals gets more and more higher, but the heat in the terminal-receiving cavities 30 can flow to exterior space via the grooves 31, thus the temperature of the terminals can be declined.

While preferred embodiment in accordance with the present invention has been shown and described, equivalent modifications and changes known to persons skilled in the art according to the spirit of the present invention are considered within the scope of the present invention as defined in the appended claims.

What is claimed is:

1. An electrical connector for attaching an IC package to a circuit member comprising:
 a base defining a bottom surface and a plurality of side walls;
 a cover mounted on the base;
 a plurality of terminals received in the base;
 a plurality of solder balls connecting to the terminals and extending below the bottom surface of the base for soldering to the circuit member;
 wherein the base defines a plurality of continuous uninterrupted groove upwardly recessed from the bottom surface thereof and extending from one side wall toward another opposed side wall along most of the bottom surface extent between such opposed sidewalls, and at least one end of each of the grooves is communicated with exterior space to facilitate heat ventilation wherein the housing includes a lever slidably moving the cover relative to the base, wherein the side wall of the base define a plurality of openings, wherein the two side walls of the base defines a plurality of recesses so as to take off the IC package from the cover conveniently.

* * * * *